United States Patent
Borella et al.

(10) Patent No.: US 6,732,314 B1
(45) Date of Patent: May 4, 2004

(54) METHOD AND APPARATUS FOR L2TP FORWARD ERROR CORRECTION

(75) Inventors: Michael S. Borella, Naperville, IL (US); Guido Schuster, Des Plaines, IL (US); Ikhlaq S. Sidhu, Vernon Hills, IL (US); Jerry Mahler, Prospect Heights, IL (US)

(73) Assignee: 3Com Corporation, Marlborough, MA (US)

( * ) Notice: Subject to any disclaimer, the term of this patent is extended or adjusted under 35 U.S.C. 154(b) by 0 days.

(21) Appl. No.: 09/579,921

(22) Filed: May 26, 2000

(51) Int. Cl.⁷ .............................................. H03M 13/00
(52) U.S. Cl. ....................... 714/752; 714/776
(58) Field of Search ......................... 370/238, 338, 370/395; 709/223, 239, 250; 700/21; 714/752, 776

(56) References Cited

U.S. PATENT DOCUMENTS 6,081,508 A * 6/2000 West et al. ................. 370/238
6,434,149 B1 * 8/2002 Jackson et al. ............. 370/395
6,452,915 B1 * 9/2002 Jorgensen ................... 370/338
6,473,793 B1 * 10/2002 Dillon et al. ............... 709/223
6,480,748 B1 * 11/2002 Gerszberg et al. ............ 700/21
6,484,210 B1 * 11/2002 Adriano et al. ............. 709/239
6,519,651 B1 * 2/2003 Dillon ......................... 709/250

* cited by examiner

Primary Examiner—David Ton
(74) Attorney, Agent, or Firm—McDonnell Boehnen Hulbert & Berghoff

(57) ABSTRACT

Method and apparatus of establishing an L2TP tunnel. A routing device of a first IP network is coupled to a public network and a routing device of the second private IP network is coupled to the public network. An L2TP tunnel is initiated and an IP address from an address space of the first private IP network is provided. An L2TP tunnel is maintained between the routing device of the first IP network and the routing device of the second private IP network. Data traffic is tunneled between the first and the second IP network over the public network via the L2TP tunnel. A control mechanism is utilized for providing L2TP tunnel traffic error correction.

19 Claims, 11 Drawing Sheets

METHOD AND APPARATUS FOR L2TP FORWARD ERROR CORRECTION

BACKGROUND OF THE INVENTION

1. Field of the Invention

This invention relates to the field of telecommunications and more specifically to a method and apparatus for providing Layer Two Tunneling Protocol (L2TP) forward error correction.

2. Description of Related Art

Layer Two Tunneling Protocol (L2TP) is a mechanism that enables automatic tunneling between a dialup user and a private network. L2TP may also be used to establish a Virtual Private Network (VPN) between two distinct IP networks connected by a third public network, such as the Internet. Unlike IP-in-IP tunneling, L2TP offers a number of advantages. For example, L2TP can encapsulate an entire PPP session within an X/IP/UDP session, where X is a data-link protocol. L2TP also allows for negotiation of session parameters via a virtual control channel and provides sequence numbers and retransmission mechanisms for reliability, flow control, and congestion control. L2TP is also extensible via user-defined extension headers.

A current L2TP protocol is discussed and detailed in the document entitled "Layer Two Tunneling Protocol "L2TP"", Network Working Group, Request for Comments: 2661, August 1999 which is herein entirely incorporated by reference and to which the reader is directed to for further information.

Although there are advantages to using L2TP for tunneling between a remote user and a private network, L2TP has certain drawbacks. For example, L2TP does not allow for the use of error correction. For example, the current L2TP protocol does not allow for an established tunnel to include forward error correction. The protocol, therefore, does not allow either the remote user and/or the local network to enable forward error correction for an established tunnel. In addition, in instances where forward error correction is not required for the entire tunnel, the L2TP protocol does not allow for an established call or a plurality of calls within a tunnel to utilize forward error correction. Moreover, the L2TP protocol does not allow a routing device of a first private network, such as an Local Area Concentrator (LAC) router or Remote Access Concentrator (RAC), to establish forward error correction within an entire tunnel or just for a specific "session" or call. There is, therefore, a need for forward error correction where L2TP is used.

SUMMARY OF THE INVENTION

The present invention relates to a method of establishing an L2TP tunnel between a first IP network and a first private IP network. A routing device of the first IP network is coupled to a public network and a routing device of the first private IP network is coupled to the public network. An L2TP tunnel is initiated from either the routing device of the first IP network or the routing device of the private IP network. An IP address from an address space of the first private IP network is provided and the L2TP tunnel is maintained between the routing device of the first IP network and the routing device of the second private IP network. Data traffic is tunneled between the first and the second IP network over the public network via the L2TP tunnel. A control mechanism is utilized for providing L2TP tunnel traffic error correction.

In another aspect of the invention, an L2TP call is established between a first IP network and a first private IP network. A routing device of the first IP network and a routing device of the first private IP network is coupled to the public network. An L2TP call is initiated between the routing device of the first IP network and the routing device of the private IP network. The first IP network is provided with an IP address of the first private IP network. The L2TP call is maintained between the routing device of the first IP network and the routing device of the second private IP network. The L2TP call traffic is tunneled between the first and the second IP network over the public network. A control mechanism is utilized for providing L2TP call traffic error correction.

BRIEF DESCRIPTION OF THE DRAWINGS

Preferred embodiments of the present invention are described herein with reference to the drawings, in which.

DETAILED DESCRIPTION

Figure 1:
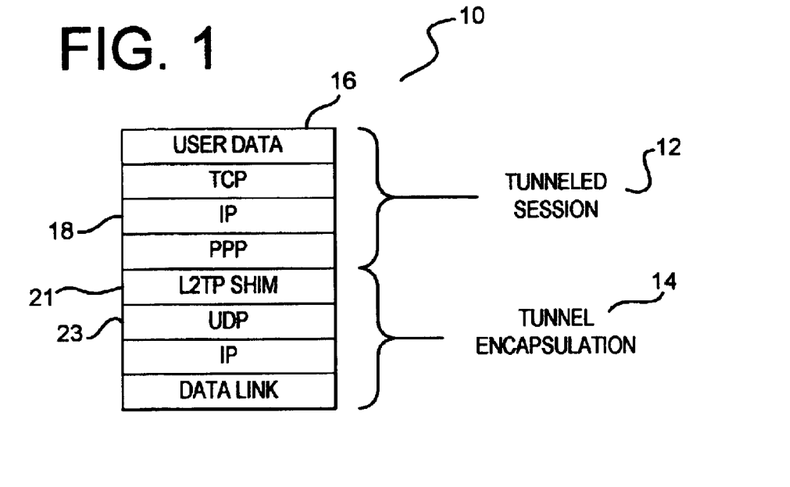
FIG. 1 illustrates a Layer Two Tunnel Protocol (L2TP) stack.

FIG. 1 illustrates an example of an L2TP protocol stack 10 for encapsulation of a TCP session over an IP network. L2TP stack 10 includes a tunneled session 12 and a tunnel encapsulation 14. Tunneled session 12 consists of user data 16 in a PPP/IP/TCP or PPP/ID/UDP packet 18.

PPP/IP/TCP packet 18 is encapsulated by an IP/UDP packet with an L2TP shim header 21 at the beginning of a UDP payload 23. L2TP Shim header 21 provides tunnel and session identification. Shim header 21 also provides a version number, sequence numbers, and other control information.

Figure 2:
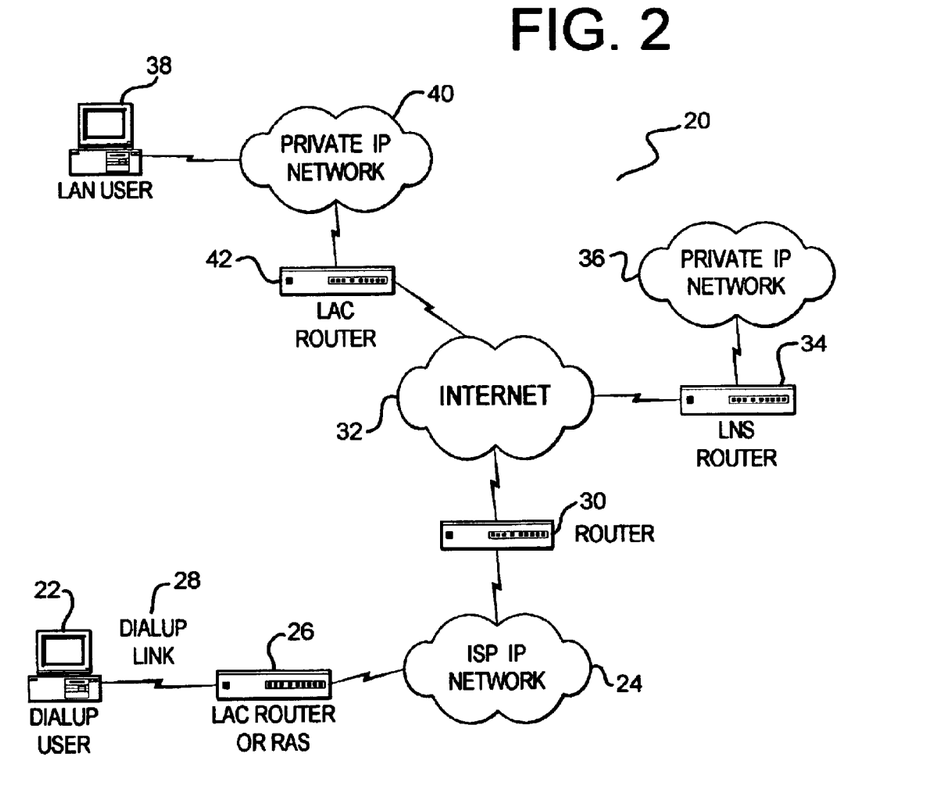
FIG. 2 illustrates an L2TP architecture.

The architecture of a set of networks that may provide L2TP support to the users of some of these networks is illustrated in the network architecture 20 illustrated in FIG. 2. By way of example, and without limitation, architecture 20 illustrates essentially two different types of cases wherein L2TP may be used.

Those skilled in the art will appreciate that the system shown in FIG. 2 is an example only, and does not represent the only embodiments in which the present invention may be realized.

In the first case, dialup user 22 dials into an Internet Service Provider (ISP) 24 over dialup link 28 via LAC router or (Remote Access Server) RAS 26. ISP access router 26 serves as an L2TP Access Concentrator (LAC). Router 26 establishes an L2TP tunnel on behalf of the user 22 to the L2TP Network Server (LNS) at a private IP network 36. LAC 26 determines the endpoint of the tunnel from a number of sources including dialup or caller ID.

For example, LAC 26 may determine the endpoint of a tunnel from a dialup user's authentication profile. Alternatively, LAC 26 determines the endpoint of the tunnel from an E. 164 phone number.

A first authentication occurs where user 22 tunnels over LAC 26 to ISP IP network 24. LAC 26 then tunnels a user's PPP session via router 30 over Internet 32 to the LNS router 34 where authentication occurs a second time. LNS router 34 removes the L2TP and serves as a virtual access concentrator, terminating the user's PPP session. LNS router 34 authenticates a second session authentication dialup user 22 and provides dialup user 22 with an IP address from the private IP network's address space. To dialup user 22, it may seem as if the user 22 is connected directly to private IP network 36. The case where dialup user 22 connects to LNS router 34 demonstrates how an individual (e.g., such as an employee working at dialup user 22) might telecommute from a remote office into a private network, such as an organization or a corporate private network.

In contrast to the first case illustrated in FIG. 2, another case may include both a first and a second private IP network. For example, the second case illustrated in FIG. 2 includes a system wherein an organization or company owns two private IP networks such as first private IP network 40 and the second private IP network 36. Networks 40, 36 are coupled to the Internet 32. LAN user 38, and therefore first private network 40, is coupled to Internet 32 via an LAC router 42. LAC router 42 initiates and maintains an L2TP tunnel to LNS router 34 at the second private IP network 36. LNS router 34 couples Private IP network 36 to Internet 32. Traffic between first IP private network 40 and second private IP network 36 is tunneled over Internet 32.

In both the first and second tunneling systems generally described with respect to FIG. 2, encryption may be used to provide privacy across Internet 42. In addition, LAC router 42 and LNS router 34 functionality may be implemented on top of an existing router or access concentrator (modem pool) architecture. Alternatively, LNS router 34 (and perhaps LAC router 42) may be implemented as part of a firewall.

As will be understood by those of ordinary skill in the art, more than one tunnel may be established between an L2TP Access Concentrator and an L2TP Network Server. L2TP tunnels may be controlled via a single control connection. Control connection for a given tunnel handles the setup, the modification, and the teardown of sessions (i.e., calls) within a given tunnel. Generally, a single L2TP Access Concentrator is associated with a particular call or session. Alternatively, a dialup user, such as dialup user 22 shown in FIG. 2, may have multiple virtual connections to an LNS, wherein each of a user's connections designates a different call or a different tunnel. One of the advantages for multiple virtual connections is that these connections enable a user's voice and data session with different quality of service parameters.

Figure 3:
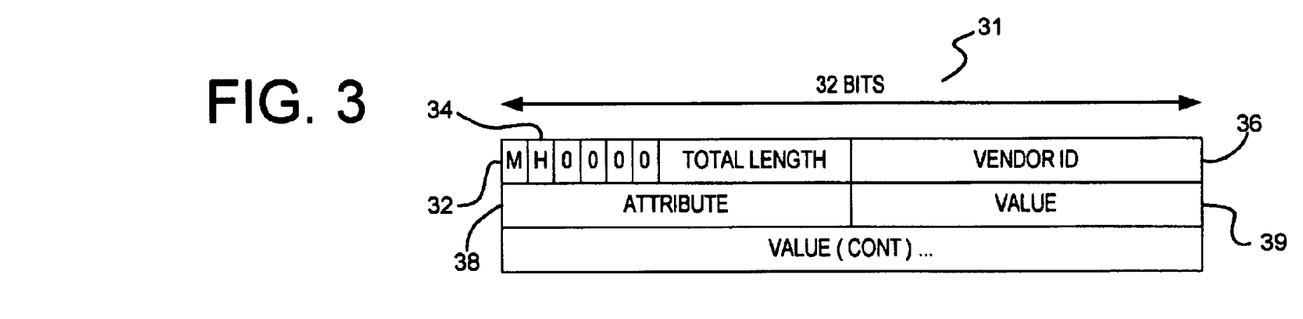
FIG. 3 illustrates a preferred Attribute Value Pair (AVP) format for use with the L2TP architecture illustrated in FIG. 2.

As described in the protocol "Layer Two Tunneling Protocol "L2TP" A. Valencia et al. previously incorporated herein by reference, L2TP utilizes an Attribute-Value Pair (AVP) format. An AVP defines an attribute and the attribute's associated value. A single control packet may contain one or more AVPs. FIG. 3 illustrates an L2TP AVP format 31. As illustrated in FIG. 3, AVP format 31 has various data fields.

The "M" field 32 of AVP format 31 designates a Mandatory bit ("M"). The Mandatory bit "M" determines the behavior of a call or a tunnel when an LAC or an LNS receives an AVP that the LAC or the LNS does not recognize. If M is set on an unrecognized AVP associated with an individual session (or call), the session is terminated.

If M is set to an unrecognized AVP associated with a tunnel, the entire tunnel will be terminated. If M is "0", an LAC or LNS should ignore an unrecognized AVP. In general, a session, a call, or a tunnel is terminated with the M bit only if the unrecognized AVP is critical to the type of communication that will occur.

The AVP format 31 also includes an "H" field 34 which designates a Hidden bit. The Hidden bit controls the "hiding" of the value field. When an LAC and LNS have a shared secret, they may encrypt sensitive data, such as passwords, by performing a message digest ("MD") hash function, such as an MD5 hash on the data. If such an MD5 hash is performed, the H bit is set. Further details of the MD5 hash are discussed in Valencia et al. previously incorporated entirely by reference.

The Total Length field designates the total number of bytes in the AVP. For AVPs defined by a private vendor, the vendor must place its IANA-assigned vendor ID code in the Vendor ID field 36 here. This allows extensibility and vendor-specific features.

The Attribute field 38 provides a code for the actual attribute, which must be unique with respect to the vendor ID. The Value field 39 encodes the value of the attribute. The length of this field is equal to the value of the total length field minus six.

Figure 4:
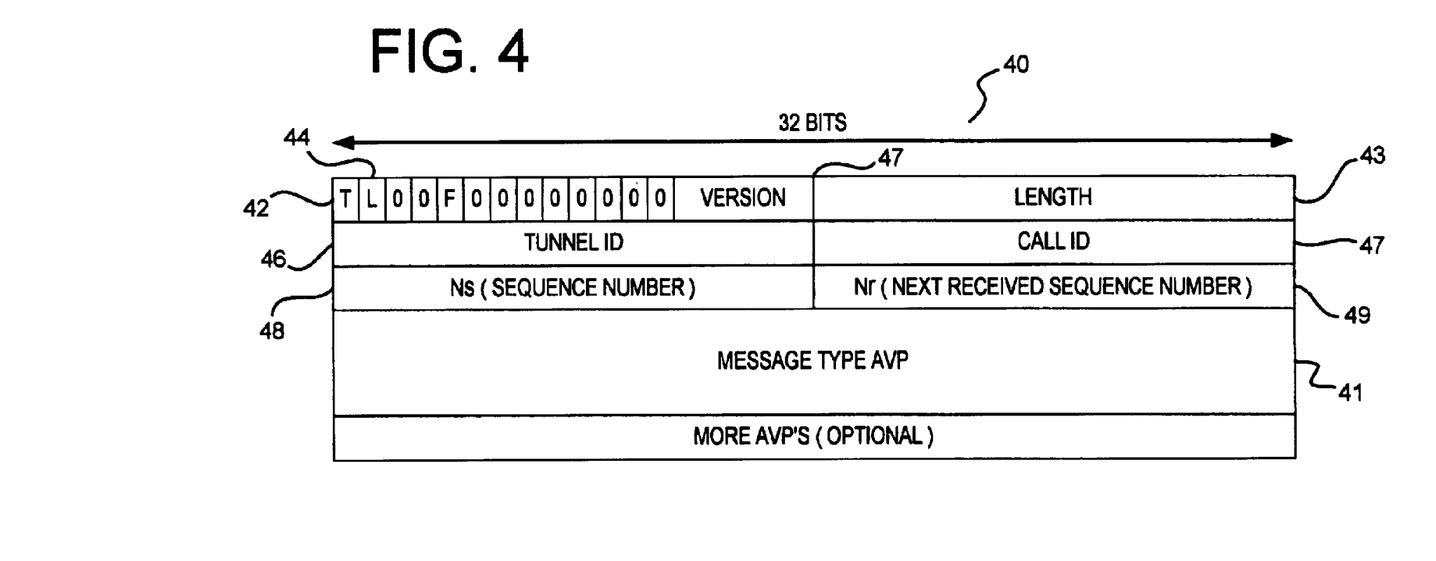
FIG. 4 illustrates a preferred control packet format for use with the L2TP architecture illustrated in FIG. 2.

FIG. 4 illustrates a preferred L2TP control packet format 40 that can be utilized with AVP format 31 of FIG. 1. Control packet format 40 consists of a 12-byte fixed header followed by a Message Type AVP. The Message Type AVP may be followed by other AVPs.

T field 42 designates a control packet. The L field 44 designates that the length field is present. The "F" field 42 designates that the sequence number fields are present. The version field 47 is preferably set to 2. The "Length" field 43 defines the total length of the control packet, including header and all AVPs. "Tunnel ID" field 46 defines the numeric tunnel identifier. "Tunnel ID" field 46 is set to zero if a tunnel is yet to be established. "Call ID" field 47 is a numeric call identifier. "Call ID" field 47 is set to zero if call is yet to be established.

The "Ns" or "Sequence Number" 48 field defines a packet's sequence number. The "Nr" or "Next Received Sequence Number" field 49 field defines the next sequence number that a sender expects to receive a packet with from a receiver. The "Message type AVP" field 41 is as an AVP that describes the type of this message.

Figure 5:
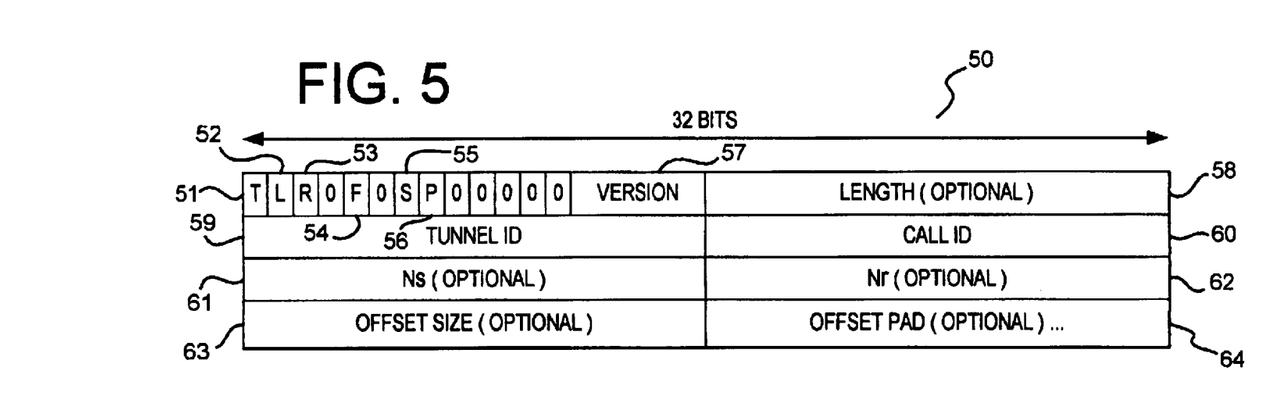
FIG. 5 illustrates a preferred data packet format for use with the L2TP architecture illustrated in FIG. 2.

FIG. 5 illustrates an L2TP data packet format 50. The "T" field 51 indicates a data packet and is preferably zero. The "L" field 52 is set when the optional length field is present. The "R" field 53 signifies that the packet recipient should reset the received sequence number state variable to the value in the Ns field and must be zero if F is not set. The "F" field 54 is set when the optional sequence number fields are present. The "S" field 55 is set when the offset size field is present. If the "P" field 56 is set, this packet should be treated preferentially by the recipient. The "Version" field 57 is set to a value of 2, thereby indicating L2TP. The "Length" field 58 indicates the total length of the control packet, including header and all AVPs.

The "Tunnel ID" field 59 is a numeric tunnel identifier. The Tunnel ID field 59 is set to zero if tunnel is yet to be established. The "Call ID" field 60 is a numeric call identifier. The "Call ID" field 60 is set to zero if a call or tunnel is yet to be established.

The "Ns" field 61 is a packet's sequence number. The "Nr" field 62 is the next sequence number that a sender expects to receive a packet with from the receiver. The "Offset Size" field 63 is the number of bytes past the L2TP header at which the payload begins. The "Offset Pad" field 64 is preferably set to zeros.

Figure 6:
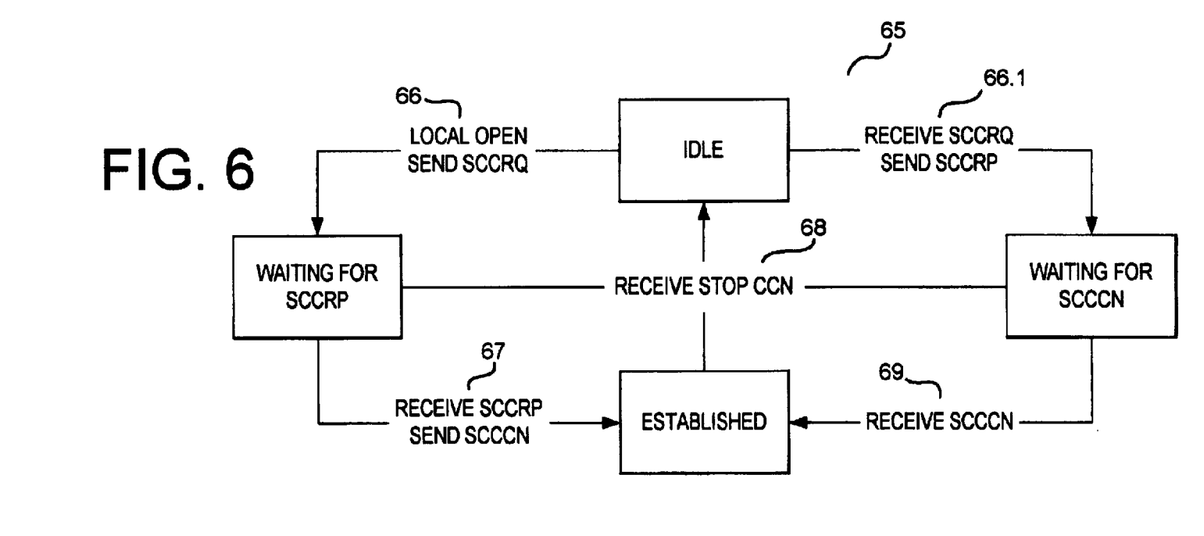
FIG. 6 illustrates a flowchart for tunnel establishment and teardown of L2TP.

FIG. 6 illustrates a tunnel establishment and tunnel teardown flowchart 65. Either a sender of data or a receiver of data may initiate tunnel establishment. Flowchart 65 utilizes the AVP, the control packet, and the data packet formats illustrated in FIGS. 3, 4, and 5, respectively. As shown in FIG. 6, L2TP tunnel establishment and teardown 65 is accomplished via a three-way handshake of various control messages. To accomplish the three-way handshake, a data sender (such as LAC 26 or 42 shown in FIG. 2) sends a Start-Control-Connection-Request (SCCRQ) message 66. A receiver (such as LNS 34 shown in FIG. 2) receives the SCCRQ 66.1 and responds with sending a Start-Control-Connection-Reply (SCCRP) message. Once the LAC receives the SCCRP, the LAC completes the handshake with a Start-Control-Connection-Connected (SCCCN) message 67. A tunnel is established once the SCCCN message is received 69.

The illustrations in flowchart 65 may also be used to exchange operating parameter information of the LAC and LNS, as defined by standardized AVPs. These messages may contain extension functionality with the use of additional AVPs.

In a TCP/IP network, such as network 20 illustrated in FIG. 1, the LNS default listen port is 1701. Preferably, a tunnel is established when an LAC transmits a UDP packet (usually an SCCRQ message-FIG. 6) to an LNS listen port. The LAC and LNS may continue to communicate using port 1701. Alternatively, the LAC and LNS alter transmit and listen ports dynamically. Once a tunnel is established, tunneled sessions or "calls" may originate from either the LAC or the LNS.

An L2TP tunnel may be torn down from either the data receiving or the data originating source with the transmission of a Stop-Control-Connection-Notification (StopCCN) message 68. The recipient of a StopCCN message terminates all calls within the tunnel and cleans up tunnel state. No acknowledgment of or response to the StopCCN is transmitted to the originator of a message.

As referred to herein, sessions within an L2TP tunnel are referred to as "calls." A single tunnel may contain up to $2^{16}-1$ calls. Once an L2TP tunnel is established, L2TP control messages may be utilized by the LAC and LNS for the establishment and teardown of calls, as well as tunnel management and tunnel status.

Figure 7:
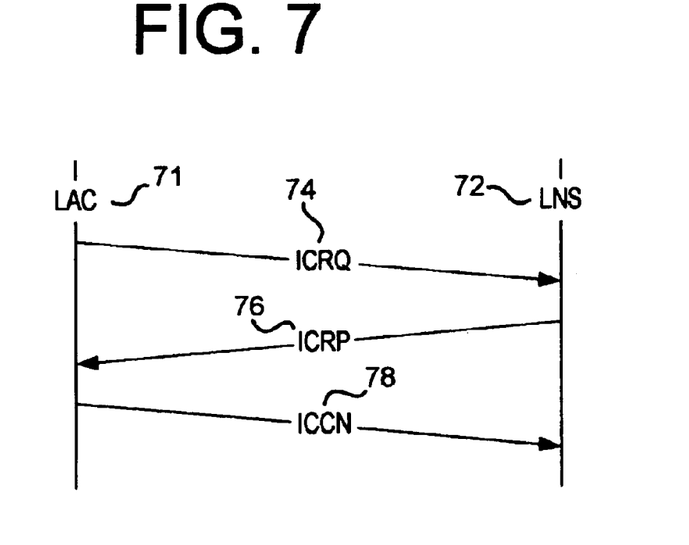
FIG. 7 illustrates a flowchart for incoming call flow once an L2TP tunnel has been established.

FIG. 7 illustrates an incoming call flow diagram 70 once an L2TP tunnel has been established. Flow diagram 70 establishes an incoming call between an LAC and an LNS, such as LAC 42, 26 and LNS 34 illustrated in FIG. 2, An incoming call (from LAC 71 to LNS 72) is established via a three-way handshake.

For example, LAC 71 transmits an Incoming-Call-Request (ICRQ) message 74 to LNS 72. LNS 72 receives the ICRQ and responds with an Incoming-Call-Reply (ICRP) message 76. LAC 71 receives ICRP 76 and completes the handshake with an Incoming-Call-Connected (ICCN) message 78. Aside from establishing the three-way handshake, messages 74, 76, and 78 may also be used to exchange information about caller identity and the capabilities of LAC 71 and LNS 72, as defined by standardized AVPs. Messages 74, 76, and 78 may also contain extension functionality with the use of additional AVPs.

Figure 8:
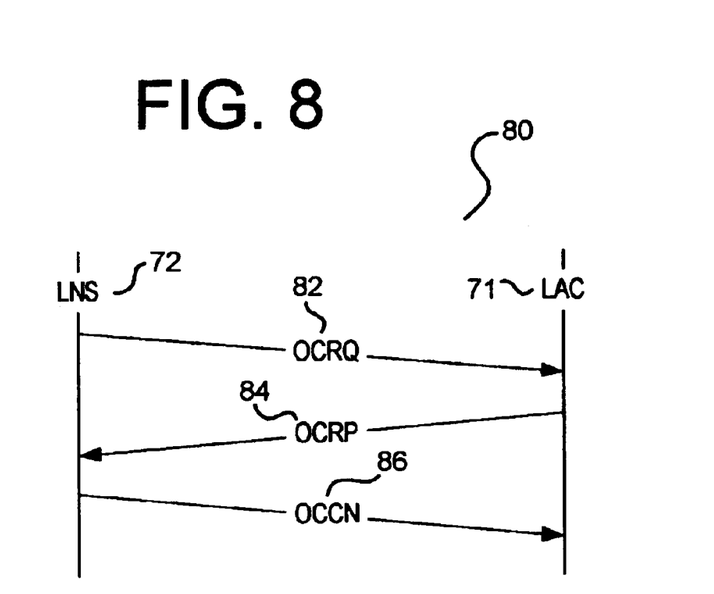
FIG. 8 illustrates a flowchart for outgoing call flow once an L2TP tunnel has been established.

FIG. 8 illustrates an outgoing call flow diagram 80 for establishing an outgoing call once a tunnel has been established. The outgoing call is established between an LAC and a LNS such as LAC 42, 26 and LNS 34 illustrated in FIG. 2. An outgoing call (from LNS 72 to LAC 71) is established via a two-way, three-message handshake. LNS 72 may initiate the outgoing call by initiating an Outgoing-Call-Request (OCRQ) message 82. LAC receives OCRQ 82 and responds by transmitting to LNS 72 an Outgoing-Call-Reply (OCRP) message 84. LAC 71 completes the handshake by transmitting an Outgoing-Call-Connected (OCCN) message 86 once a recipient of the call picks up the line. Messages 82, 84, and 86 are used to exchange information about caller identity and the capabilities of the LAC and LNS, as defined by standardized AVPs. Messages 82, 84 and 86 may also contain extension functionality with the use of additional AVPs.

Once an outgoing call is established, a Set-Link-Info (SLI) message may be transmitted from the LNS to the LAC to re-negotiate call parameters. The SLI message may only re-negotiate PPP parameters as described in the L2TP RFC. However, by utilizing additional AVPs, an SLI message may be used to modify arbitrary call parameters.

Once a call has been established, the call may be torn down from either the LAC or LNS with the transmission of a Call-Disconnect-Notify (CDN) message. Upon receiving a CDN message, a party that receives the CDN message terminates the call and clean up call state. No acknowledgment of or response to the CDN message is sent to the originator of the message.

As previously discussed, although the L2TP protocol has many advantages, L2TP does not allow for the correction of errors that may occur during tunnel transmission. For example, L2TP does not allow for any type of error correction coding, including forward error correction (FEC). Forward error correction is the addition of redundancy at the source of a stream of data that will allow the receiver to correct for errors that occur in transit. FEC has been used on the bit level in many communication systems, such as CDMA and deep-space radio. In a system having a lossy channel for which the cost of re-transmission may be greater than that of the extra bandwidth required by redundant data (e.g., has a large bandwidth-delay product), FEC is a candidate for performance improvement.

Although FEC has been examined in high-speed packet-switched networks, such as the Internet, FEC has not been previously proposed for use with L2TP. In general, high-speed packet-switched networks exhibit negligible loss due to bit errors. However, such networks may lose up to 10%–20% of all packets transmitted due to congestion at intermediate routers and switches. Reducing packet loss benefits both UDP and TCP streams. For UDP-based packet audio, FEC may increase a user's perceived quality of service (QoS). For TCP-based transactions, FEC may increase the throughput and may also reduce the delay of a session by preventing TCP from entering slow-start or congestion-avoidance modes.

FEC occurs over a block of n data packets. For each block, k FEC packets are generated, thus creating a transmit window of n+k packets. The FEC code is a function of the bits of the n data packets that maps to k FEC packets such that out of a window of length n+k, if k or fewer packets are lost, all n data packets are guaranteed to be recovered at the receiver.

Figure 9:
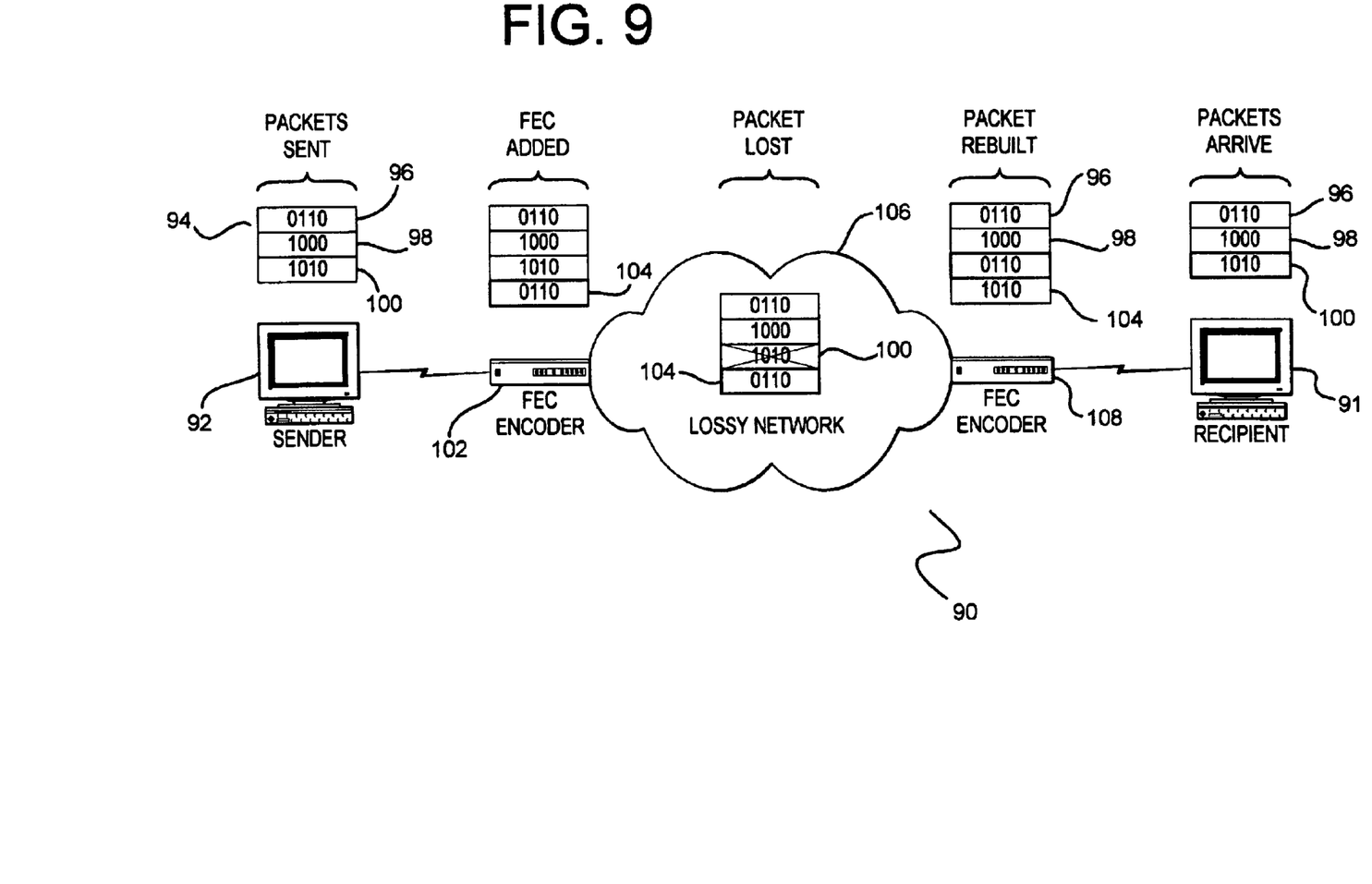
FIG. 9 illustrates a system of forward error correction coding (FEC)

FIG. 9 illustrates an example of a system 90 for utilizing FEC. As shown in system 90, a sender 92 transmits a set of data packets 94 to a recipient 91. Set 94 includes three 4-bit packets 96, 98, and 100. These 4-bit packets 96, 98, and 100 are received by an FEC encoder 102. Encoder 102 produces an FEC packet 104 and adds packet 104 to the 4-bit packets received 96, 98, and 100. Preferably, FEC is computed as a column-wise XOR of the three packets 96, 98, and 100. The resulting four 4-bit packets 96, 98, 100, and 104 are transmitted across a lossy network 106. During transmission over network 106, one of the transmitted packets may become lost. For the sake of this example, it is assumed that the third packet 100 becomes lost.

The remaining two data packets 96, 98 and FEC packet 104 arrive at an FEC decoder 108. Decoder 108 re-builds the lost packet 100 by performing a column-wise XOR of the three packets that were successfully transmitted over network 106. The three data packets are passed on to the recipient, while the FEC packet is discarded by decoder 108.

FEC encoding and decoding does not require that all data packets of a block be present at the same time. Running FEC packets can be incrementally built and stored in registers as packets arrive. Consequently, a lost packet that is successfully re-built may be delayed while the decoder waits for the last packet in the window to arrive and performs the FEC recovery. Within a block of packets, FEC may cause some packets to arrive out of order. These factors have practical implications on the performance of TCP and real-time UDP streams.

In system 90 of FIG. 9, it is assumed that all data packets have the same payload length. In practice, however, this will not generally be the case. The unequal packet size case can be accommodated by padding out shorter packets to the length of the longest packet in the block, then performing FEC as above on these packets. Since an implementation of an encoder will not know the length of the longest packet in a block when the first packet is received, the implementation must assume that the payload length is that of the payload MTU of the tunnel. Also, at least one of the k FEC packets must contain the real payload length of each of the data packets. Preferably, all FEC packets contain this information, to protect against the case that one or more are lost. Providing this information in a control packet will limit the MTU payload of data packets.

In a preferred embodiment of the present invention, FEC functionality is added to L2TP through the use of control mechanisms, such as AVPs added to control packets. Data packet transmission is not modified except to limit the MTU of the user-to-LNS PPP session. The control mechanisms of the present invention enable a number of features. These features include: specifying an error correction encode/decode scheme; initializing, replacing, or removing an existing error correction scheme with a different error correction scheme; and specifying sequence numbers and payload lengths of the data packets that an error correction packet has encoded.

Initializing, replacing, and/or removing a particular error correction scheme, such as a FEC scheme from a tunnel allows a system to respond to loss detected in the tunnel. Such a loss may be detected by either the LAC or LNS. Preferably, either an LAC or an LNS may initiate error correction negotiation. Alternatively, error correction is added to a tunnel or added to a particular call within a tunnel, preferably on a static, administrative basis.

In one exemplary embodiment, error correction AVPs are added to various tunnel establishment and/or teardown messages. For example and referring to the tunnel establishment flowchart shown in FIG. 6, error correction AVPs are added to handshake messages SCCRQ, SCCRP, or SCCCN thereby initiating error correction within an entire tunnel.

Alternatively, where error correction is added or deleted from a single session or a single call, error correction AVPs may be added to incoming call flow messages, such as the ICRQ, ICRP, or ICCN messages illustrated in FIG. 7. In this manner, error correction may be initiated for an incoming call from a remote routing device, such as an LAC.

In yet another illustrative embodiment, for outgoing calls originating at a local routing device such as an LNS, error correction AVPs may be added to outgoing call messages OCRQ and OCRP (FIG. 8). Since the OCCN messages flow in the same direction as an OCRP message, confirmation messages may be added to outgoing error correction setup. This may be accomplished with an additional OCCN transmitted from the LNS to the LAC.

Within a tunnel, control mechanisms such as control messages may be used to dynamically initialize an FEC scheme, change an existing FEC scheme, or remove an existing FEC scheme for a particular call, an entire tunnel, or a plurality of tunnels. Within an L2TP tunnel utilizing error correction, packets will be assigned sequence numbers.

In an exemplary embodiment of the present invention, error correction AVPs may be categorized into three basic categories. For purposes of discussion, the error correction scheme discussed is a forward error correction scheme. However, as those of ordinary skill in the art will appreciate, other forums of error correction may be utilized aside from forward error correction.

Where forward error correction is the type of error correction scheme utilized, these three basic categories of FEC AVPs are FEC Scheme Specification, FEC Scheme Control, and FEC Data Packet Length. These basic categories of FEC AVPs will be discussed generally and then specific applications along with specific flowcharts will be described in detail below.

The first type of FEC AVP, FEC Scheme Specification AVPs, preferably specify the various system FEC schemes. The second type of FEC AVP, FEC Scheme Control AVPs, allow a sender or receiver of L2TP data traffic to initialize, to modify, or to remove an FEC scheme. FEC Data Packet Length AVPs allow a data packet sender to specify the call ID, the sequence numbers and the payload length of data packets in an FEC window. Preferably, the FEC AVPs are marked optional by having their M bit set to zero. (FIG. 3.)

FEC Scheme Specification "FECSS" AVPs specify an FEC scheme. Preferably, an FECSS AVP has a data structure similar to AVP format 31 illustrated in FIG. 3 and has a total length of eight bytes. In a preferred embodiment, in the two-byte value field, a code of "0" indicates the NULL FEC scheme. The NULL FEC scheme signifies that no FEC is to be used. Other values can be defined to be a particular combination of block size (n), number of FEC packets (k), and FEC encode/decode scheme. While a wide variety of parameter combinations exist, in general, small values of n and k have been shown to be particularly useful. For example, where n=3 or 4, k=1, and an XOR encode/decode scheme may improve the performance of a lossy channel while adding a limited amount of overhead. Values of k>1 may be useful on channels with bursty packet loss.

FEC Scheme Control "FECSC" AVPs allow a routing device to initialize, to modify, or to remove an FEC scheme. Except for the FECSC remove, an FECSC AVP is preferably followed by one or more FECSS AVPs. FECSC AVPs are generally eight bytes in length and have a similar attribute code as shown in FIG. 3.

The first byte of the value field of an FECSC AVP refers to the directionality of the control operation to be performed. For example, a code of "0" may designate that the direction of control operation is from the packet sender to the packet receiver. Alternatively, a code of "1" may designate that the direction is from the receiver to the sender and a code of "2" may designate that the control operation is bidirectional. The second byte of the value field may be set to "0" for initialize, "1" for modify, and "2" for remove.

FEC ID/Sequence Number/Data Length "FECID" AVPs specify sequence number and length of each of the data packets in a control data block. FECID length AVP is variable. Preferably, for each of the n data packets a two-byte call ID, two-byte sequence number code, and two-byte length code is represented in this AVP's value field. For example, when n=3, the value field is 18 bytes long, with the first two bytes representing call ID of the first data packet, the next two bytes representing the sequence number of the first data packet, the next two bytes representing the payload length of the first data packet, and so on.

FEC Encoding "FECEN" AVPs specify an FEC encoding of some number of data packet payloads. Preferably, the FECEN AVP value field contains the encoding, and is of variable length.

In one aspect of the present invention, a plurality of L2TP control messages may be used to facilitate L2TP forward error correction. For example, a first error correction scheme may be used from a packet sender to an intended receiver, while a second error correction scheme may be used from the same receiver to the same sender. This second error correction scheme may or may not be the same as the first scheme. Alternatively, error correction may occur in one direction (i.e., from sender to receiver) but not in the opposite direction (i.e., from receiver to sender). If a tunnel endpoint that does not support error correction receives an error correction-specific control message, the tunnel endpoint can discard the error correction-specific control message.

A FEC Request "FECRQ" message may be transmitted by either a sender or receiver. A routing device may transmit an FECRQ when the routing device decides to modify a current FEC scheme (if a scheme is currently being implemented). A message type AVP may be followed by one or more FECSS AVPs representing FEC schemes that a sender needs to decode.

If the intended receiver of an FECRQ does not respond with an FEL reply message "FECRP" within a reasonable amount of time, or after a suitable number of traffic re-transmissions, the FECRQ sender should assume that the intended receiver does not support FEC.

The intended receiver transmits a FEC Response (FECRP) message in response to an FECRQ. The recipient of the FECRQ responds with one or more FECSS AVPs representing FEC schemes that the sender is able to encode. These FECSS AVPs are a subset of those received in the FECRQ. If a recipient does not support any of the FEC schemes proposed by the sender or if the receiver decides not support any of the FEC schemes proposed by a sender, the receiver may respond with a control message such as a NULL FECSS AVP. If the receiver does not support FEC, it can discard the FECRQ.

Preferably, a FEC Connect "FECCN" message is transmitted in response to an FECRP. The receiver of the FECRP chooses a FEC scheme out of the FEC schemes listed by the FECRP. The recipient transmits an FEC AVP for that scheme back to the sender. This action completes the three-way handshake of FEC setup. FEC begins with the next data packets transmitted by the recipient of FECCN. If no FEC scheme has been agreed upon, a NULL FECSS AVP may be used and consequently FEC will not occur.

An FEC Container "FECCR" control message contains an FEC encoding of the previous n data packets. Following the message type AVP, a FEC container message must contain a FECSS AVP, then aFELID/Sequence Number/Data Length FECID AVP, and then a FEL encoding AVP, FECEN AVP.

The above description provides a general discussion for using L2TP error correction for either a tunnel or a session within a tunnel via FEC AVPs. The following description provides a more detailed discussion of various aspects and various examples of tunnel and call establishment.

Those skilled in the art will appreciate that the system shown in FIG. 2 is an example only, and does not represent the only embodiments in which the present invention may be realized.

In the following discussion and for purposes of discussion only, it is assumed that a system has three valid FEC schemes available to some tunnel endpoints, these FEC schemes having FECSS codes denoted as 1, 2, and 3, respectively.

Figure 10:
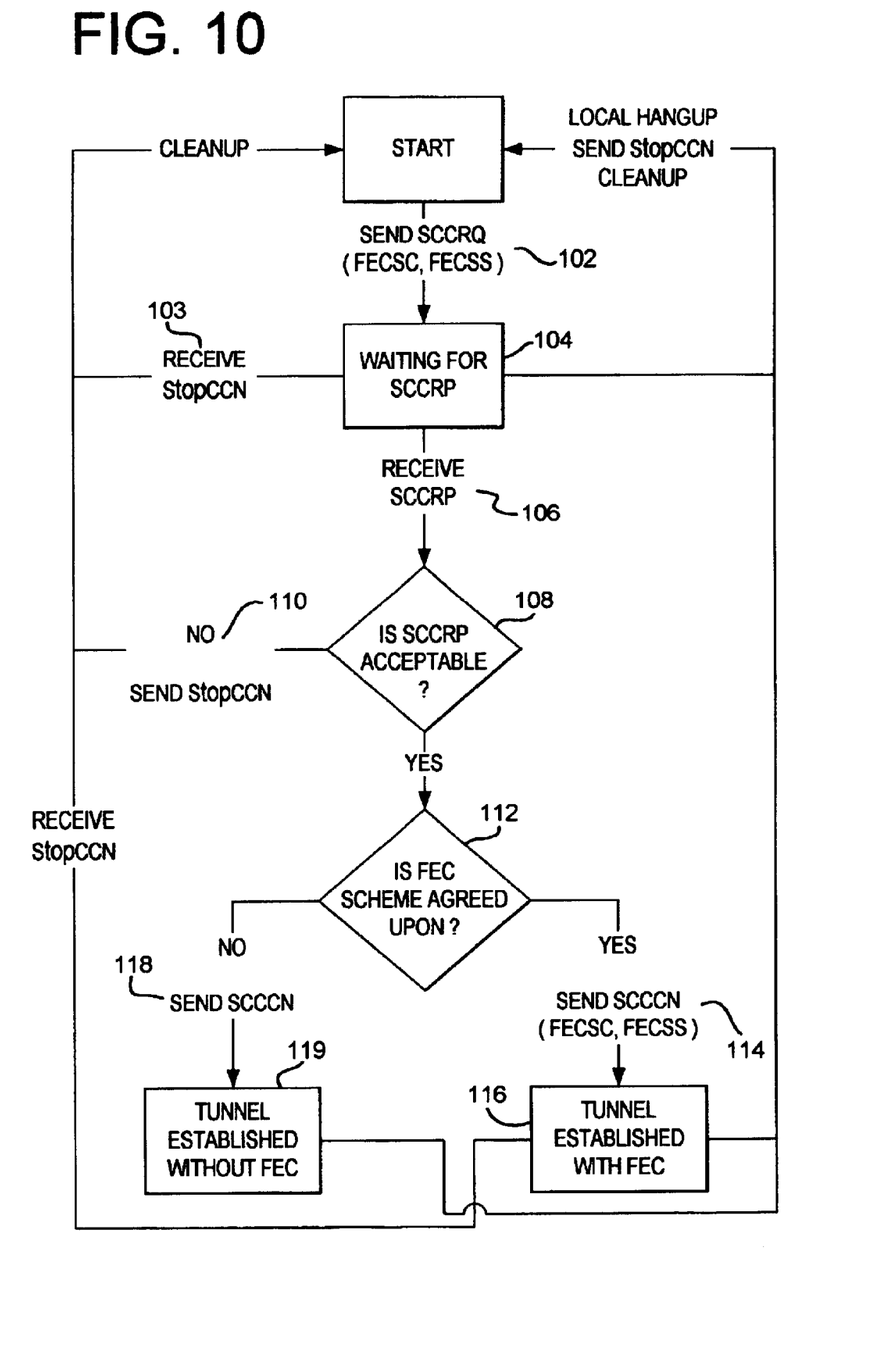
FIG. 10 illustrates a tunnel establishment state diagram from an originating side.

FIG. 10 illustrates a state diagram for tunnel forward error correction establishment wherein error correction is established from an originating routing device, such as the LAC routers shown in FIG. 2.

In this example, during initial tunnel establishment, an LAC informs a local routing device such as an LNS that the LAC wants to enable a tunnel with FEC from the LAC to the LNS. Assume for the sake of this example and for purposes of discussion only that the LAC supports FEC schemes 1 and 3, and that the LNS supports FEC schemes 2 and 3. FEC AVPs FECSC and FECSS are piggybacked onto the SCCRQ message 102.

Initially, the LAC waits for the SCCRP after transmitting an SCCRQ 102. LAC also transmits an FECSC AVP that specifies directionality from LAC to LNS. In this example, this value may be designated as "0." The FECSC AVP initializes FEC via FEC having value of "0" and represented by AVP(0). The FECSC AVP is followed by two FECSS AVPs since the LAC supports FEC schemes 1 and 3. Each FECSS AVP specifies a particular FEC scheme supported by the LAC. In this example, the two FECSS AVPs specify FEC schemes 1 and 3.

After transmitting the control mechanisms SCCRQ with piggybacked control packets FESCS, FECSS, the remote routing device LAC waits for a reply 104. During this wait period, a StopCCN message 103 may be received. Once the LNS receives the SCCRQ, LNS responds by transmitting an SCCRP. An FECSC AVP specifies directionality from LAC to LNS as a value of "1" and initialization of FEC with a value of "0." The FECSC AVP is followed by an FECSS AVP, specifying a scheme that both the LAC and LNS supports (i.e., FEC scheme 3).

LAC receives the SCCRP 106 and responds by transmitting an SCCCN. An FECSC AVP specifies directionality from LAC to LNS and initializes an FEC packet having a value of "0." The FECSC AVP is followed by an FECSS AVP, confirming the scheme that the LNS has suggested (3).

It is determined whether the SCCRP is acceptable 108. If the SCCRP is not acceptable, a StopCCN is sent 110. If the SCCRP is acceptable, it is determined whether the proposed FEC scheme is agreed upon 112. If the proposed FEC scheme is agreed upon, SCCCN message with piggybacked FECSC and FECSS control messages are transmitted 114 and consequently a tunnel with error correction is established 116 until a StopCCN is received. Alternatively, if the FEC scheme is not agreed upon, a SCCCN control message is transmitted 118 and a tunnel without error correction is established 119 until a StopCCN is received.

Figure 11:
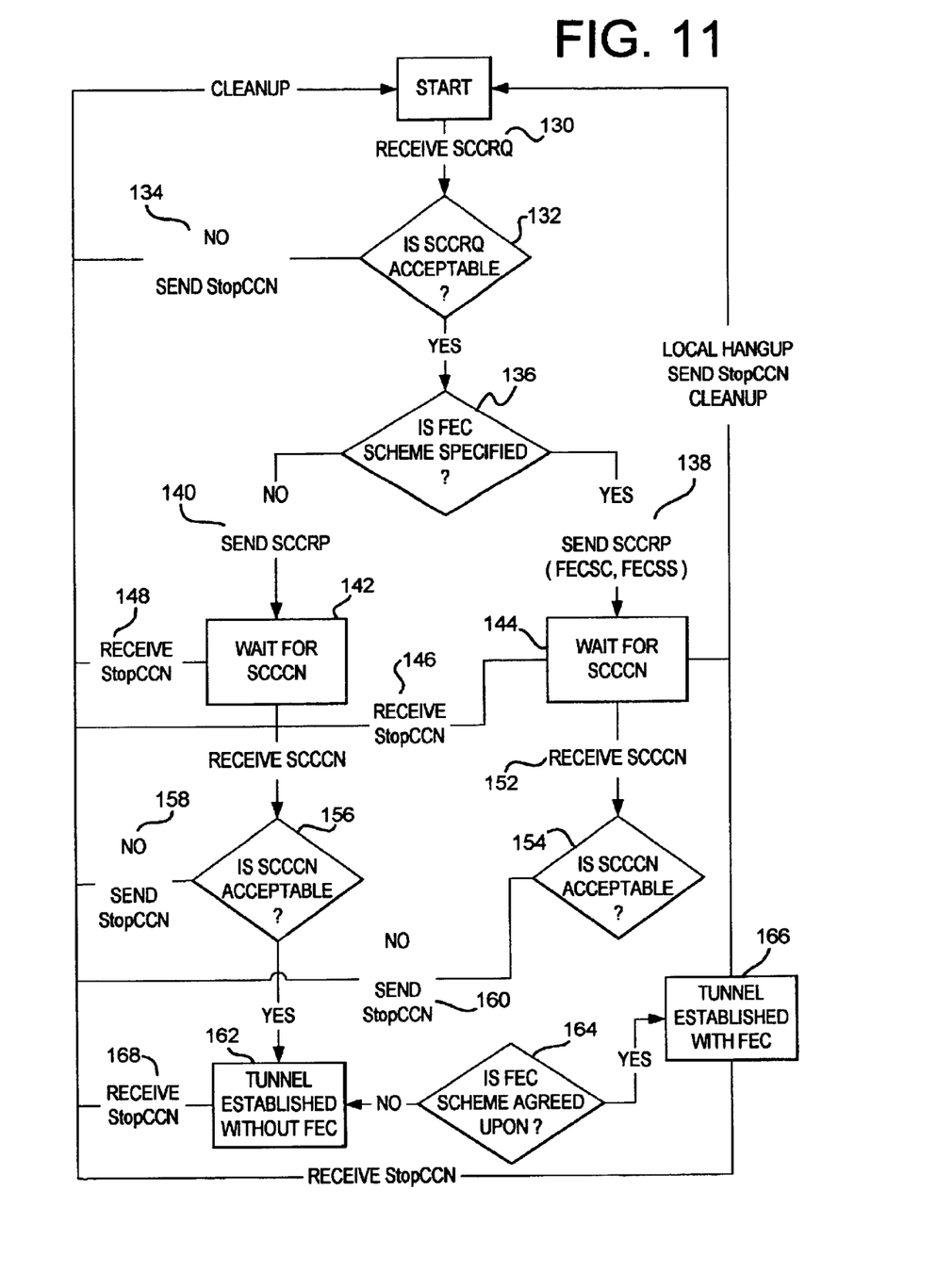
FIG. 11 illustrates a tunnel establishment state diagram from a receiving side.

As previously discussed, FEC may be established by either the sending or receiving device. FIG. 11 illustrates a state diagram for tunnel error correction establishment from a local routing device, such as LNS shown in FIG. 2.

In this scenario, during tunnel establishment, the LNS receives a SCCRQ 130 and determines whether the SCCRQ is acceptable 132. If the SCCRQ is not acceptable, a StopCCN is sent 134. If the SCCRQ is acceptable, it is determined whether the FEC scheme is specified 136.

If the FEC scheme is not specified, a SCCRP 140 is sent and the LNS waits for a SCCCN 142. If a StopCCN is received, the tunnel is torn down. Alternatively, if the LNS receives a SCCCN 150, it is determined whether the SCCCN is acceptable 156. If the SCCCN is acceptable, a tunnel between the LAC and LNS is established without FEC 162. The tunnel is established until a StopCCN 168 is received. If, however, the SCCCN is not acceptable, a StopCCN is sent 158.

Returning to step 136, if the FEC scheme is specified, the LNS sends a SCCRP with piggybacked FECSC, and FECSS control messages 138. The LNS then waits for the LAC to send a SCCCN 144. During this wait period, LNS may receive a StopCCN 146. If the LNS receives a SCCCN 152, it is determined whether the SCCCN is acceptable 154.

If the SCCCN is not acceptable, a StopCCN is sent 160. If the SCCCN is acceptable, it is determined whether an FEC scheme is agreed upon 164. If a scheme is agreed upon, a tunnel with FEC is established 166. If a scheme is not agreed upon, a tunnel is established without FEC 162 until a StopCCN is received 168.

Figure 12:
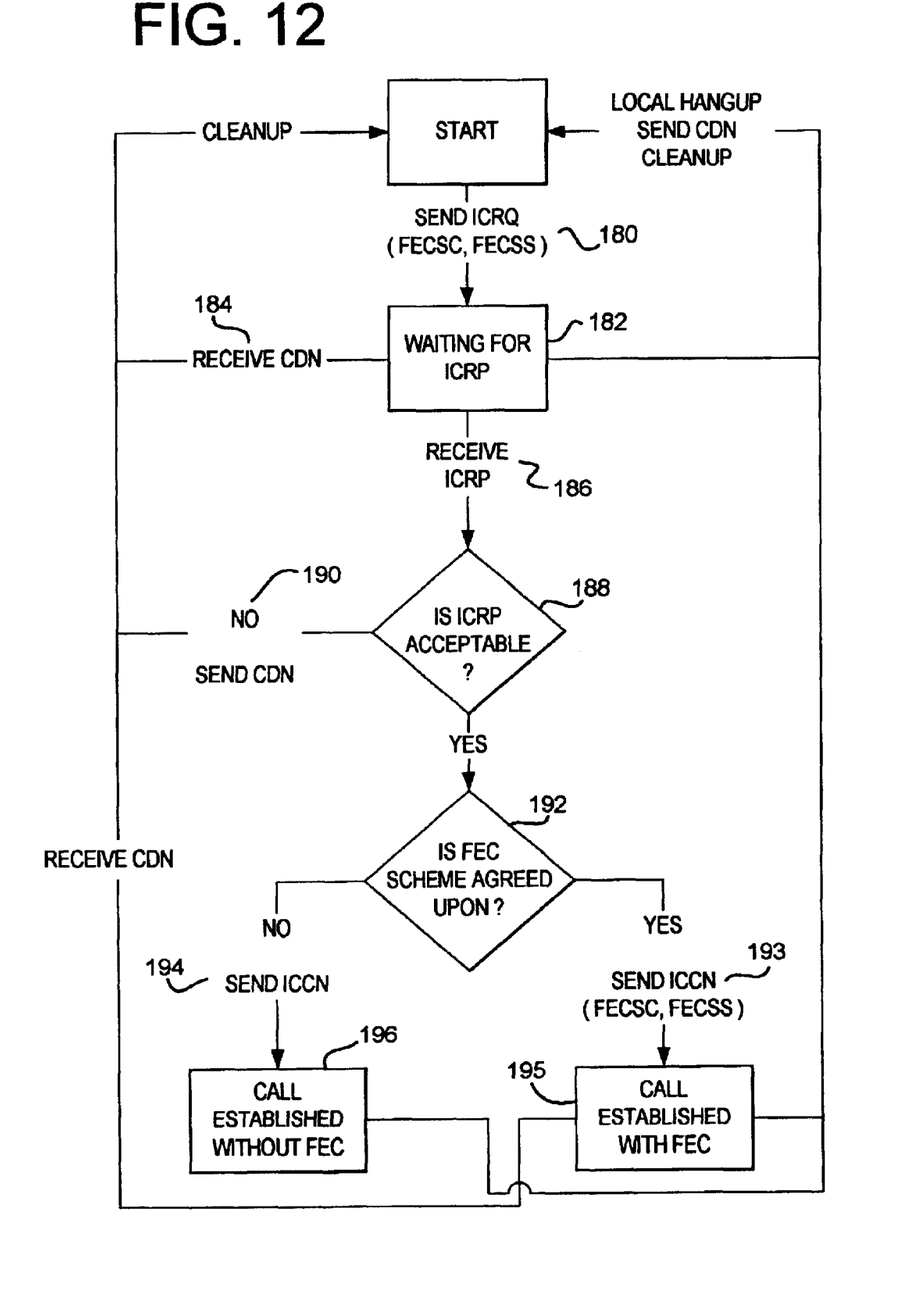
FIG. 12 illustrates an incoming call establishment state diagram from the side of the LAC illustrated in FIG. 2.

FIG. 12 illustrates a state diagram for establishing FEC for a single incoming call from a remote routing device, such as an LAC. In this scenario, during call setup, the LAC informs the LNS that the LAC intends to enable FEC from the LNS to LAC. For purposes of this example only, it is assumed that the LAC supports FEC scheme I while the LNS does not support FEC scheme I but only supports FEC scheme 3. Therefore, in this example system, the LAC and LNS will not be able to use FEC, and this FEC establishment will fail. However, it should be noted that this FEC establishment failure will not impact the success of the call setup. The FEC AVPs will be piggybacked onto the ICRQ/ICRP/ICCN three-way handshake of the incoming call flow illustrated in FIG. 7.

As shown in FIG. 12, LAC transmits a request message ICRQ along with a FECSC and a FECSS 180. FECSC AVP specifies directionality from LNS to LAC and in this example denoted by a "1" and initialization of FEC having a value of "0." The FECSC AVP is followed by an FECSS AVP that specifies that the LAC supports FEC scheme having a value of "1."

The LAC waits for the LNS to respond with an ICRP 182. An FECSC AVP specifies directionality from LNS to LAC which is denoted by a "0" and initialization of FEC will be denoted by "0." The FECSC AVP is followed by a NULL FECSS AVP, specifying that neither the LAC nor LNS support a common FEC scheme, or that the LNS currently does not want to use FEC.

Once the LAC receives the ICRP 186, the LAC determines whether the ICRP is acceptable 188. If the ICRP is not acceptable, a CDN is sent 190. If the ICRP is acceptable, it is determined whether the FEC scheme is agreed upon 192. If the FEC scheme is agreed upon, an ICCN, a FECSC and a FECSS is sent 193 and a FEC call is established 195. Since in this example an FEC scheme is not agreed upon, a ICCN is sent 194 and a call is established without FEC 196 until a CDN is received.

If at step 192 a FEC scheme is not agreed upon, a ICCN is sent 194 and a call is established without FEC 196.

Figure 13:
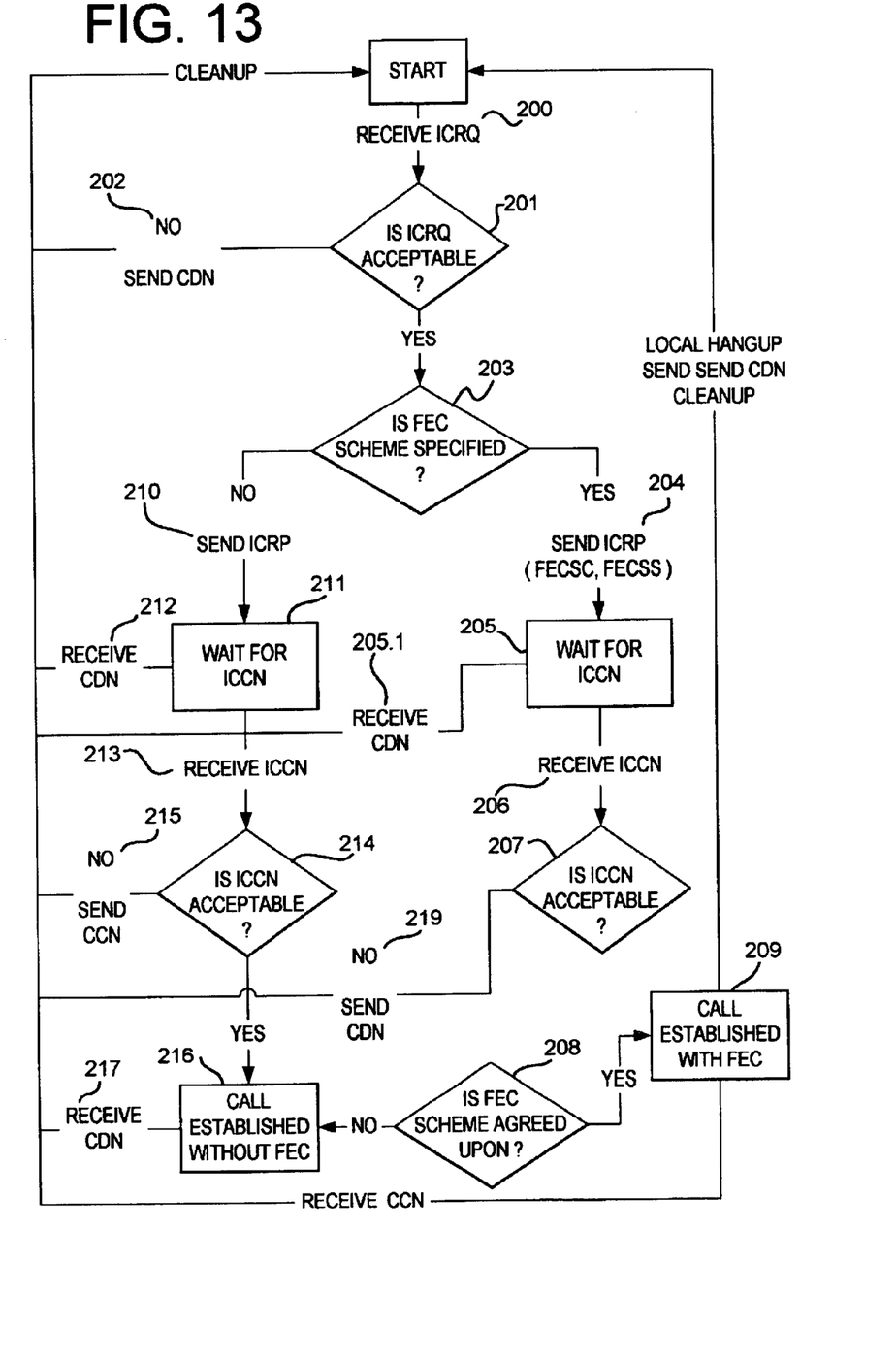
FIG. 13 illustrates an incoming call establishment state diagram from the side of the LNS illustrated in FIG. 2.

FIG. 13 illustrates a state diagram for call establishment forward error correction from the LNS side. As shown in FIG. 13, the LNS receives an ICRQ 200 and determines whether the ICRQ is acceptable 201. If the ICRQ is not acceptable, a CDN is sent 202.

If the ICRQ is acceptable, it is determined whether the FEC scheme is specified 203. If an FEC scheme is not specified, an ICRP is sent 210 and the LNS waits for an ICCN 211. If a CDN is received 212, the call is torn down. If, however, a ICCN is received 213, it is determined whether the ICCN is acceptable 214. If the ICCN is not acceptable, a CDN is sent 215. If the ICCN is acceptable, a call is established without FEC 216 until a CDN is received 217.

If, however, at step 203, a FEC scheme is specified, a ICRP with piggybacked AVPs, FECSC, and FECSS is sent 204. The LNS then waits for a LAC to send an ICCN 205. During this wait period, if the LNS receives an ICCN 206, it is determined whether the ICCN is acceptable 207. If the ICCN is not acceptable, a CDN is sent 219. If the ICCN is acceptable, it is determined whether the FEC scheme is agreed upon 208. If agreed upon, a call is established with FEC 209. If it is not agreed up on a call is established without FEC 216 until a CDN is received 217.

Figure 14:
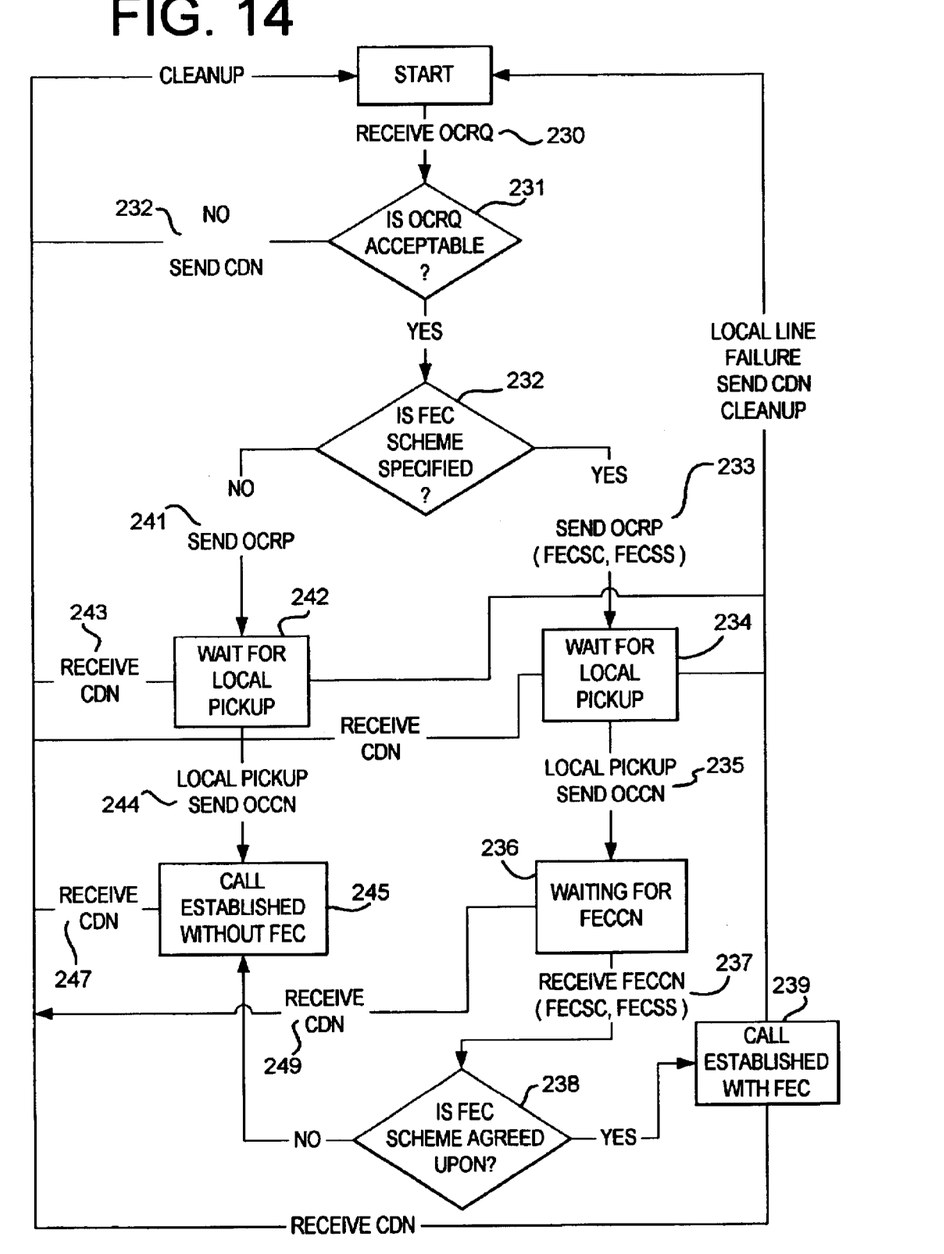
FIG. 14 illustrates an outgoing call establishment state diagram from the side of the LAC illustrated in FIG. 2.

FIG. 14 illustrates establishment of error correction for an outgoing call, from the call originating side. In this scenario, during call setup, an LNS informs the LAC that the LNS wants to enable FEC to the LAC.

To initiate incoming call error correction establishment, LNS transmits an OCRQ. LAC receives OCRQ 230 and determines whether the OCRQ is acceptable 231. If OCRQ is not acceptable, a CDN is sent 232. If OCRQ is acceptable, it is determined whether an FEC scheme is specified 232. If a FEC scheme is specified, a OCRP message with piggybacked FECSC and FECSS messages is transmitted 233 and the LAC waits for local call pick up 234. After local pickup, an OCCN is transmitted 235. No FEC information is transmitted in this message. If during the wait for local pickup 234 a CDN is received, the call is terminated.

Once the LNS receives the OCCN, the LAC responds by transmitting an FECCN. After receiving FECCN 236 along with FEC messages FECSC and FECSS, the LAC determines whether the FEC scheme is agreed upon 238. If the FEC is agreed upon, an outgoing call is established with FEC 239. If the FEC is not agreed upon, a call is established without FEC 245 until a CDN is received 247. If the FEC scheme is not specified 232, an OCRP is sent 241 and the LAC waits for local pickup 242. After local pickup, an OCCN is sent 244 and a call is established without FEC 245 until a CDN is received.

Figure 15:
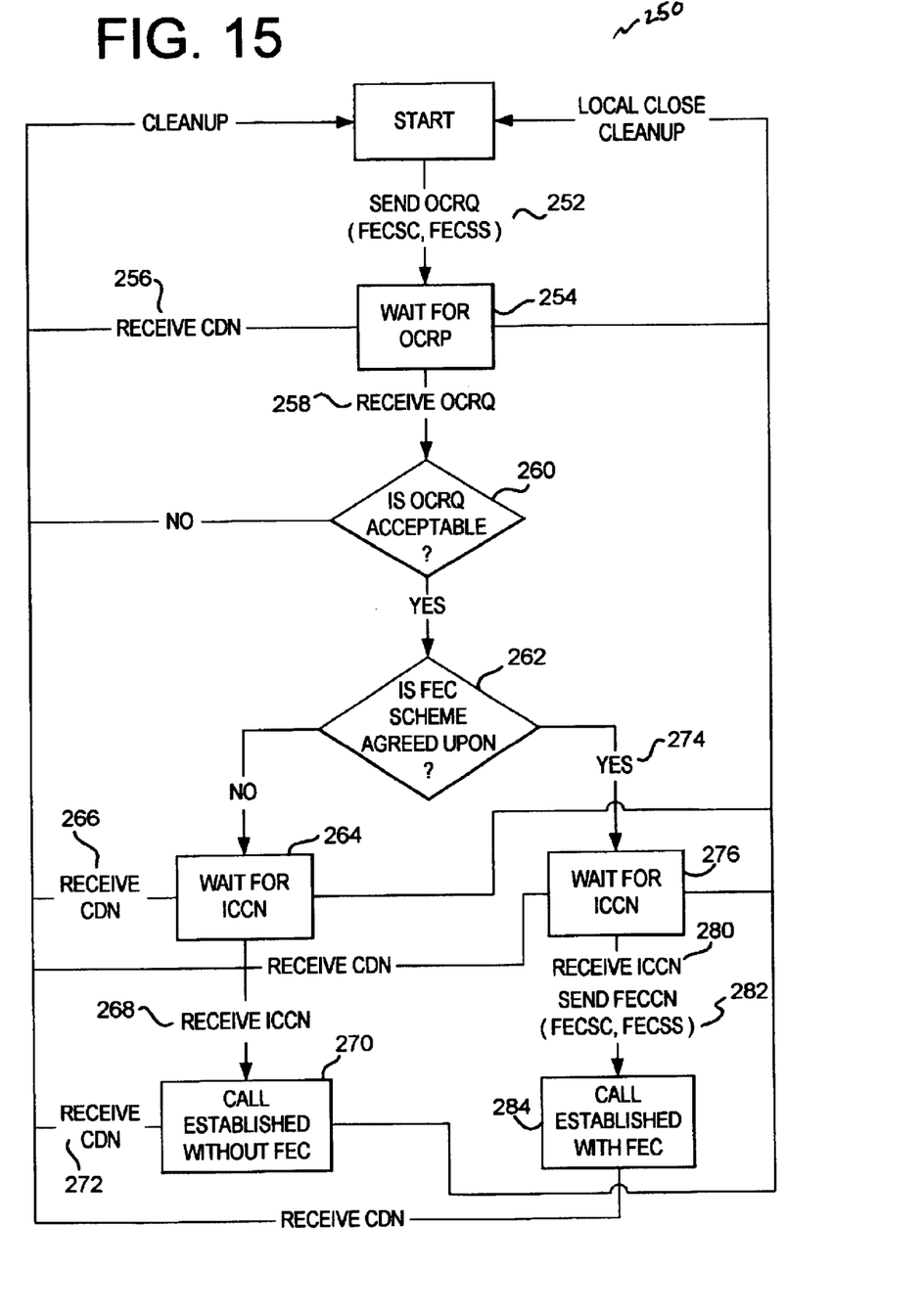
FIG. 15 illustrates an outgoing call establishment state diagram from the side of the LNS illustrated in FIG. 2.

FIG. 15 illustrates an outgoing call establishment state diagram from the side of the LNS illustrated in FIG. 2.

In this outgoing call state diagram 250, the LNS sends a OCRQ message with piggybacked FECSC and FECSS control messages 252. The LNS then waits for the LAC to send an OCRP 254. If the LNS receives a CDN 256, the call is terminated. Once the LNS receives an OCRP 258, the LNS determines whether the OCRQ is acceptable 260. If it is unacceptable, the call is terminated; otherwise, it is determined whether the FEC scheme is agreed upon 262.

If the FEC scheme is not agreed upon, the LNS waits for a ICCN 264 or a CDN 266. If an ICCN is received 268, a call without FEC is established 270 until a CDN is received 272.

If the FEC scheme is agreed upon 274, the LNS waits for an ICCN 276. Once the LNS receives an ICCN 280, it sends out a FECCN with piggybacked control messages 282 and a call with FEC is established 284 until a CDN is received 286.

Preferred embodiments of the present invention have been described herein. It will be understood, however, that changes may be made to the various features described without departing from the true spirit and scope of the invention, as defined by the following claims.

We claim:

1. A method of establishing an L2TP tunnel between a first IP network and a first private IP network comprising the steps of:

coupling a routing device of the first IP network to a public network;

coupling a routing device of the first private IP network to the public network;

initiating an L2TP tunnel from either the routing device of the first IP network or the routing device of the private IP network;

authenticating the first IP network;

providing the first IP network with an IP address from an address space of the first private IP network;

maintaining the L2TP tunnel between the routing device of the first IP network and the routing device of the second private IP network;

tunneling data traffic between the first and the second IP network over the public network via the L2TP tunnel; and utilizing a control mechanism for providing L2TP tunnel traffic error correction.

2. The invention of claim 1 wherein the L2TP tunnel comprises a plurality of virtual connections.

3. The invention of claim 1 wherein the control mechanism is a Forward Error Correction mechanism.

4. The invention of claim 1 wherein the routing device of the first IP network is a Local Area Concentrator.

5. The invention of claim 1 wherein the routing device of the private IP network is a Local Network Server.

6. The invention of claim 1 wherein the first IP network is a private IP network.

7. The invention of claim 1 wherein the control mechanism comprises at least one Attribute Value Pair format within a control packet.

8. The invention of claim 1 wherein the routing device of the first IP network is implemented as part of a firewall.

9. The invention of claim 1 wherein the routing device of the first private IP is implemented as part of a firewall.

10. The invention of claim 1 wherein the L2TP tunnel is initiated by the routing device of the first IP network.

11. The invention of claim 10 wherein the L2TP call traffic error correction is initiated by the routing device of the second private IP network.

12. A method of establishing an L2TP call between a first IP network and a first private IP network comprising the steps of:

coupling a routing device of the first IP network to a public network;

coupling a routing device of the first private IP network to the public network;

initiating an L2TP call between the routing device of the first IP network and the routing device of the private IP network;

authenticating the first IP network;

providing the first IP network with an IP address from an address space of the first private IP network;

maintaining the L2TP call between the routing device of the first IP network and the routing device of the second private IP network;

tunneling L2TP call traffic between the first and the second IP network over the public network; and utilizing a control mechanism for providing L2TP call traffic error correction.

13. An L2TP protocol stack including a tunnel session; and a tunnel encapsulation wherein said tunnel encapsulation comprises control packets for initiating forward error correction.

14. The invention of claim 13 wherein the control packets include FEC Attribute Value Pairs.

15. L2TP communication link between a remote user and a private IP network comprising the steps of:

establishing an L2TP tunnel between the originating user and an L2TP Network Server at the private IP Network;

exchanging information between the user and the private IP Network;

authenticating the remote user;

providing the remote user with an IP address from a private IP network's address space;

receiving an incoming tunnel connection from the dial up user;

determining whether a switched tunnel connection needs to be made to the L2TP Network Server in accordance with information relating to the remote user;

initiating a switched tunnel connection for switching traffic from the incoming tunnel connection to the L2TP Network Server the switched tunnel connection; and utilizing control messages to specify a first error correction encoding/decoding scheme for the L2TP communication link.

16. A network in which L2TP information packets are transmitted between a user and a receiver, the network comprising:

A dialup link; a dialup user dialing into an Internet Service Provider over the dialup link;

a Remote Access Server serving as an L2TP Access Concentrator;

an L2TP tunnel established on behalf of the dialup user to a L2TP Network Server (LNS at a private IP network by adding FEC AVPs to various tunnel establishment and/or teardown messages.

17. The invention of claim 16 wherein the LAC determines an endpoint of the tunnel from the dialup user's authentication profile.

18. The invention of claim 16 wherein the LAC determines an endpoint of the tunnel from a E.164 phone number.

19. The invention of claim 16 wherein the LAC determines an endpoint of the tunnel via a static configuration.

* * * * *